United States Patent
Park et al.

(10) Patent No.: US 12,260,089 B2
(45) Date of Patent: Mar. 25, 2025

(54) PROCESSING-IN-MEMORY DEVICE BASED ON SPIN ORBIT TORQUE DEVICE

(71) Applicant: Korea University Research and Business Foundation, Seoul (KR)

(72) Inventors: Jongsun Park, Seoul (KR); TaeHwan Kim, Seoul (KR); Yunho Jang, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 112 days.

(21) Appl. No.: 18/093,053

(22) Filed: Jan. 4, 2023

(65) Prior Publication Data

US 2023/0333747 A1   Oct. 19, 2023

(30) Foreign Application Priority Data

Apr. 13, 2022   (KR) .................. 10-2022-0045977

(51) Int. Cl.
*G06F 3/06* (2006.01)

(52) U.S. Cl.
CPC .......... *G06F 3/0613* (2013.01); *G06F 3/0659* (2013.01); *G06F 3/0673* (2013.01)

(58) Field of Classification Search
CPC .... G06F 3/0613; G06F 3/0659; G06F 3/0673; G06N 3/065; G06N 3/063; G11C 7/1006; G11C 11/1659; G11C 11/1675; G11C 11/54; G11C 11/1673
See application file for complete search history.

(56) References Cited

U.S. PATENT DOCUMENTS

| | | | | | |
|---|---|---|---|---|---|
| 4,920,480 | A | * | 4/1990 | Murakami | G06F 13/28 712/36 |
| 6,388,672 | B1 | * | 5/2002 | Ide | G06F 9/30014 345/538 |
| 10,489,116 | B1 | * | 11/2019 | Esposito | G06F 15/7867 |
| 2022/0236869 | A1 | * | 7/2022 | Chih | G11C 7/1006 |

FOREIGN PATENT DOCUMENTS

| | | |
|---|---|---|
| KR | 10-2018-0043698 A | 4/2018 |
| KR | 10-2020-0081623 A | 7/2020 |
| KR | 10-2020-0097396 A | 8/2020 |
| KR | 10-2020-0124803 A | 11/2020 |
| KR | 10-2208604 B1 | 1/2021 |
| KR | 10-2021-0048393 A | 5/2021 |

OTHER PUBLICATIONS

Korean Office Action issued on Jul. 23, 2024, in counterpart Korean Patent Application No. 10-2022-0045977 (6 pages in English, 6 pages in Korean).

* cited by examiner

*Primary Examiner* — Hiep T Nguyen
(74) *Attorney, Agent, or Firm* — NSIP Law

(57) ABSTRACT

Embodiments of the present disclosure provide a spin orbit torque device-based processing-in-memory device that includes a digital logic gate using a current switching and voltage controlled magnetic anisotropy (VCMA) effect of a spin orbit torque device capable of being used as a memory element, and increases the overall system energy efficiency by designing a memory capable of performing an MAC operation to reduce the number of data migration between a memory and an operator.

11 Claims, 12 Drawing Sheets

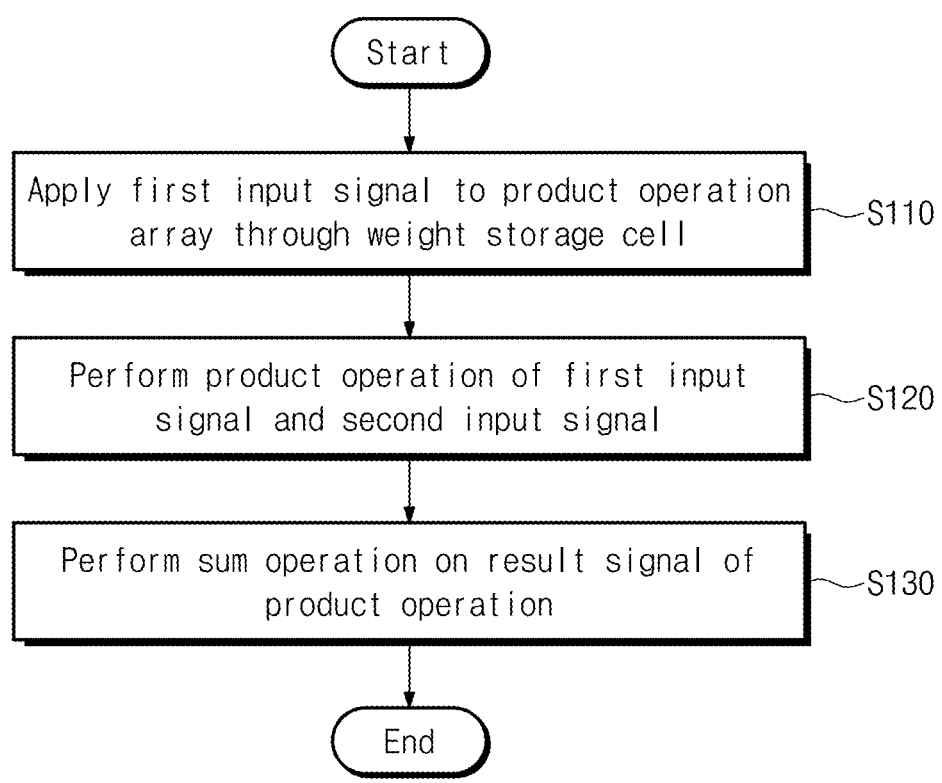

PROCESSING-IN-MEMORY DEVICE BASED ON SPIN ORBIT TORQUE DEVICE

CROSS-REFERENCE TO RELATED APPLICATIONS

This application claims priority under 35 U.S.C. § 119 to Korean Patent Application No. 10-2022-0045977 filed on Apr. 13, 2022, in the Korean Intellectual Property Office, the disclosures of which are incorporated by reference herein in their entireties.

BACKGROUND

Embodiments of the present disclosure described herein relate to a processing-in-memory device based on a spin orbit torque device. The present disclosure relates to "DEVELOPMENT OF SMART LOGIC DEVICE USING SPIN CMOS", and was supported by Samsung Electronics Co., Ltd.

Due to the innate memory bottleneck of a von-Neumann structure, an application, which requires large amounts of memory access, such as an artificial neural network has constraints in energy efficiency and operating speed in a conventional computer structure. In particular, a multiply-accumulate (MAC) operation, which corresponds to about 90% of artificial neural network operations, has low computational complexity, but is repeatedly performed. As a result, data migration between a memory and an arithmetic logic unit (ALU) is very frequent, thereby exacerbating the bottleneck.

To solve the issues, a processing-in-memory (PIM) capable of performing arithmetic operations inside the memory in addition to read/write operations is being actively researched. Especially, the PIM using a resistive memory such as a magnetic random access memory (MRAM) or a resistive memory (ReRAM) is attracting attention because the PIM may solve the leakage power of a conventional CMOS-based memory and may improve area efficiency. The conventional resistive memory-based PIM performs parallel operations by perform an analog MAC operation by using a current accumulation method. However, it has issues on the area size and power consumption of an analog-to-digital converter (ADC) required for calculation.

There is a prior art disclosed as Korean Registered Patent No. 10-2208604 (Patent Document 1).

There is a prior art disclosed as Korean Patent Publication No. 10-2021-0048393 (Patent Document 2).

SUMMARY

Embodiments of the present disclosure provide a spin orbit torque device-based processing-in-memory device that includes a digital logic gate using a current switching and voltage controlled magnetic anisotropy (VCMA) effect of a spin orbit torque device capable of being used as a memory element, and increases the overall system energy efficiency by designing a memory capable of performing an MAC operation to reduce the number of data migration between a memory and an operator.

The technical problems to be solved by various embodiments of the present disclosure are not limited to the aforementioned problem, and other technical problems not described herein will be clearly understood by those skilled in the art, to which the present disclosure pertains, from the following description.

According to an embodiment, a processing-in-memory device includes a weight storage array including a plurality of weight storage cells, each of which includes a magnetic tunnel junction (MTJ) device having resistance determined depending on a magnetization direction and in each of which a first input signal having one of logic values depending on the resistance is applied through a bit line, a product operation array including a plurality of product operation cells, each of which reads out the first input signal from at least one weight storage cell among the plurality of weight storage cells and performs a product operation of the first input signal and a second input signal applied through a voltage application line, and a sum operation array including a plurality of sum operation cells, each of which reads out a result signal of a product operation from at least one product operation cell among the plurality of product operation cells and performs a sum operation on the result signal of the product operation. The weight storage array, the product operation array, and the sum operation array are connected to each other through a calculation line to perform a multiply accumulation (MAC) operation.

For example, each of the plurality of weight storage cells may include the MTJ device connected to the bit line and a first transistor including a gate connected to a first word line and connecting the MTJ device and the calculation line depending on the first word line.

For example, when a row of at least one of the plurality of weight storage cells is selected by the first word line, the weight storage array may apply the first input signal to the product operation array through the calculation line in the at least one row.

For example, each of the plurality of product operation cells may include a first spin orbit torque (SOT) device that receives the first input signal from the calculation line, a 2-1st transistor including a gate connected to a 2-1st word line and connecting the voltage application line and the first SOT device depending on the 2-1st word line, and a 2-2nd transistor including a gate connected to a 2-2nd word line and connecting the first SOT device and the calculation line depending on the 2-2nd word line.

For example, the product operation array may perform a product operation based on an event that a direction of the first input signal flowing through the first SOT device is switched depending on a magnitude of the first input signal and a magnitude of the second input signal. The result signal of the product operation may have a logic value depending on whether the direction of the first input signal is switched.

For example, the sum operation array may include a plurality of carry cells, each of which receives the result signal of the product operation from at least one product operation cell among the plurality of product operation cells through the calculation line depending on an event that the 2-2nd transistor is turned on, and stores a carry signal for a sum operation of the result signal of the product operation, and a plurality of sum cells, each of which stores a sum signal for the sum operation of the result signal of the product operation.

For example, each of the plurality of carry cells may include at least one 2-1st SOT device that receives the result signal of the product operation, and at least one 3-1st transistor including a gate connected to at least one 3-1st word line and connecting the at least one 2-1st SOT device and the calculation line depending on the at least one 3-1st word line.

For example, each of the plurality of carry cells may store the carry signal based on an event that a direction of the result signal of the product operation is switched depending on a magnitude of the result signal of the product operation flowing through the at least one 2-1st SOT device.

For example, each of the plurality of sum cells may include a 2-2nd SOT device that receives the carry signal and the result signal and the product operation, and the 3-2nd transistor including a gate connected to a 3-2nd word line and connecting the 2-2nd SOT device and the calculation line depending on the 3-2nd word line.

For example, each of the plurality of sum cells may store the sum signal based on based on an event that a direction of an accumulated signal is switched depending on a magnitude of the accumulated signal of the carry signal and the result signal and the product operation flowing through the 2-2nd SOT device.

According to an embodiment, a processing-in-memory device includes a weight storage array including a plurality of weight storage cells, each of which includes an MTJ device having resistance determined depending on a magnetization direction and in each of which a first input signal having one of logic values depending on the resistance is applied through a bit line, a product operation array including a plurality of product operation cells, each of which reads out the first input signal from at least one weight storage cell among the plurality of weight storage cells and performs a product operation of the first input signal and a second input signal applied through a voltage application line, a sum operation array including a plurality of sum operation cells, each of which reads out a result signal of a product operation from at least one product operation cell among the plurality of product operation cells and performs a sum operation on the result signal of the product operation, and a calculation line for connecting the weight storage array, the product operation array, and the sum operation array. The calculation line defines a column line of the weight storage array, the product operation array, and the sum operation array. The weight storage array, the product operation array, and the sum operation array simultaneously perform a MAC operation on the column line.

The various embodiments of the present disclosure described above are only some of the preferred examples of the present disclosure, and various examples reflecting the technical features of various embodiments of the present disclosure may be derived and understood based on the detailed description to be described below by those skilled in the art.

BRIEF DESCRIPTION OF THE FIGURES

The above and other objects and features of the present disclosure will become apparent by describing in detail embodiments thereof with reference to the accompanying drawings.

FIG. 9 is a flowchart of a method of operating a processing-in-memory device, according to an embodiment of the present disclosure.

DETAILED DESCRIPTION

Hereinafter, implementations according to the present disclosure will be described in detail with reference to the accompanying drawings. The detailed description set forth below together with attached drawings is intended to set forth implementations of the present disclosure, and is not intended to represent the only implementations in which the present disclosure may be practiced. The following detailed description includes specific details for the purpose of providing a thorough understanding of the present disclosure. However, those skilled in the art recognize that the present disclosure may be practiced without these specific details.

Although the terms "first", "second", etc. may be used to describe various components, the components should not be construed as being limited by the terms. These terms are only used to distinguish one element from another. For example, a first element could be termed a second element, and, similarly, a second element could be termed a first element, without departing from the scope of the present disclosure.

In various embodiments of the present disclosure, "/" and "," should be interpreted as indicating "and/or". For example, "A/B" may mean "A and/or B". Furthermore, "A, B" may mean "A and/or B". Moreover, "A/B/C" may mean "at least one of A, B, and/or C". Besides, "A, B, C" may mean "at least one of A, B and/or C".

Figure 1:
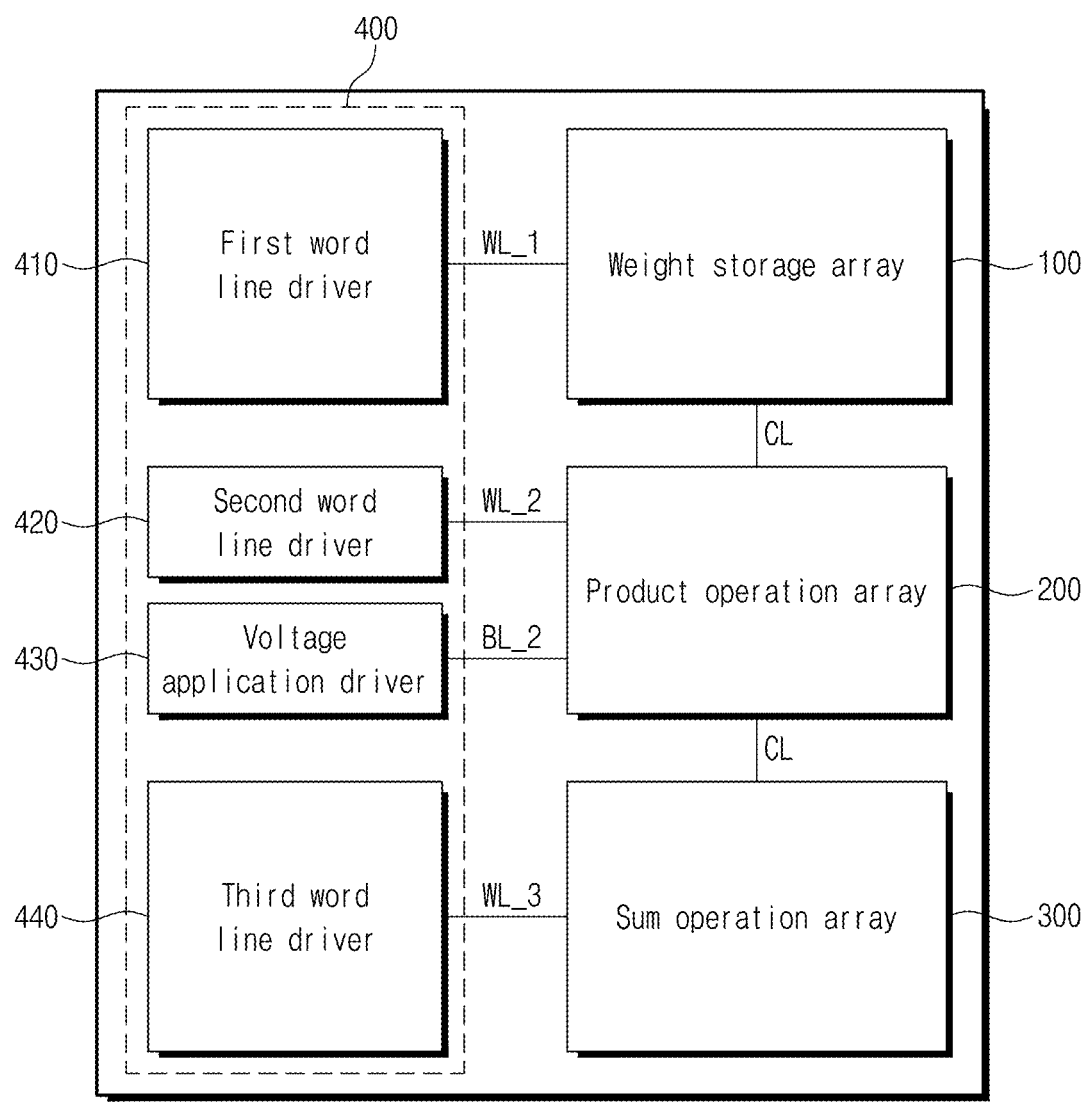
FIG. 1 illustrates a processing-in-memory device, according to an embodiment of the present disclosure.

FIG. 1 illustrates a processing-in-memory device, according to an embodiment of the present disclosure.

Referring to FIG. 1, a processing-in-memory device 10 performs a Multiply Accumulation (MAC) operation on input data. For example, the MAC operation may be defined as $$Y_j = \sum_{k=0}^{N-1} W_k X_{j-k}$$

for input data $X_{j-k}$ and weight $W_k$. Here, each of 'j' and 'k' are an index, and $Y_j$ is the result of the MAC operation.

The processing-in-memory device 10 includes a weight storage array 100, a product operation array 200, a sum operation array 300, and a peripheral circuit 400 to perform a MAC operation.

The weight storage array 100, the product operation array 200, and the sum operation array 300 are connected to each other through a calculation line CL.

The weight storage array 100 includes a plurality of weight storage cells 110, and each of the weight storage cells 110 stores a weight. The stored weight is applied to the product operation array 200 through the calculation line CL.

The product operation array 200 includes a plurality of product operation cells 210. The product operation array 200 is connected to the weight storage array 100 to read a weight and to perform a product operation between the weight and input data. Each of the plurality of product operation cells 210 stores a result of the product operation according to the product operation. The result of the product operation is applied to the sum operation array 300 through the calculation line CL.

The sum operation array 300 is connected to the product operation array 200 to read the result of the product operation, and to perform the sum operation on the result of the product operation. In detail, the sum operation array 300 reads the result of a plurality of product operations from at least two of the plurality of product operation cells 210 and performs the sum operation of summing results of the plurality of product operations.

The peripheral circuit 400 controls the weight storage array 100, the product operation array 200, and the sum operation array 300 that are described above. The peripheral circuit 400 includes first to third word line drivers 410, 420, and 440 and a voltage application driver 430.

The weight storage array 100 includes the plurality of weight storage cells 110, each of which includes a magnetic tunnel junction (MTJ) device having resistance determined depending on a magnetization direction and in each of which a first input signal having one of logic values depending on the resistance is applied through a bit line.

The peripheral circuit 400 includes the first to third word line drivers 410, 420, and 440 and the voltage application driver 430.

The first word line driver 410 is connected to the weight storage array 100 through a first word line WL_1 to control a signal applied to the first word line WL_1. The second word line driver 420 is connected to the product operation array 200 through a 2-1st word line WL_2-1 and a 2-2nd word line WL_2-2 to control signals applied to the 2-1st word line WL_2-1 and the 2-2nd word line WL_2-2. The third word line driver 440 is connected to the sum operation array 300 through a 3-1st word line WL_3-1 and a 3-2nd word line WL_3-2 to control signals applied to the 3-1st word line WL_3-1 and the 3-2nd word line WL_3-2. The voltage application driver 430 applies a second input signal to the product operation array 200 through a second bit line BL_2 to be described later.

Hereinafter, the weight storage array 100, the product operation array 200, and the sum operation array 300 will be described in detail.

Figure 2:
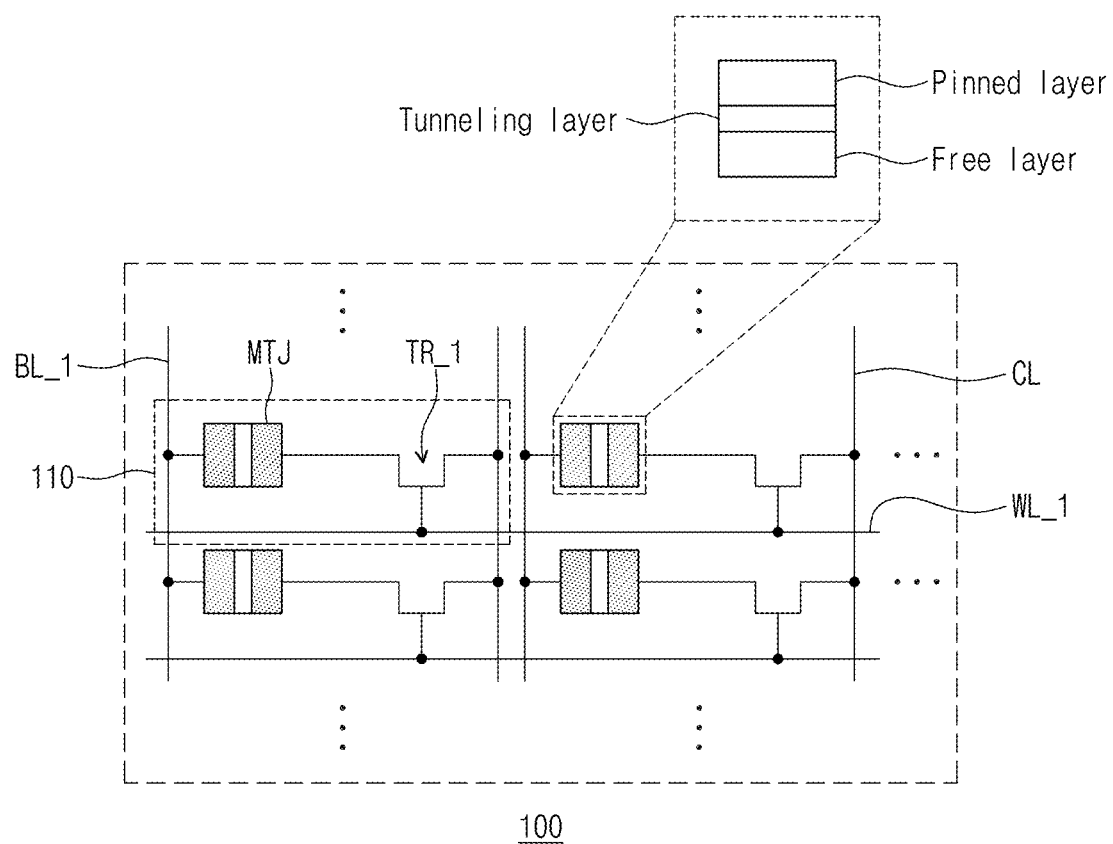
FIG. 2 shows a weight storage array, according to an embodiment of the present disclosure.

FIG. 2 shows a weight storage array, according to an embodiment of the present disclosure.

Referring to FIG. 2, the weight storage array 100 includes the plurality of weight storage cells 110. The plurality of weight storage cells 110 are connected to the first word line WL_1 in a row direction, and connected to a first bit line BL_1 and the calculation line CL in a column direction. Each of the plurality of weight storage cells 110 includes an MTJ device having resistance determined depending on a magnetization direction. In each of the plurality of weight storage cells 110, a first input signal having one of logic values depending on the resistance is applied through the first bit line BL_1.

As shown, the MTJ device MTJ has a structure in which a tunneling barrier is provided between a free layer and a pinned layer. Each of the free layer and the pinned layer may be formed of a metal layer (e.g., a ferromagnetic material, etc.) and the tunneling barrier may be formed of an insulator. At this time, the free layer is a layer in which the magnetization direction is capable of being changed, and the pinned layer is a layer in which the magnetization direction is fixed. When the magnetization direction of the free layer is the same as the magnetization direction of the pinned layer (i.e., parallel), the MTJ device MTJ indicates low resistance. When the magnetization direction of the free layer is different from the magnetization direction of the pinned layer (i.e. anti-parallel), the MTJ device MTJ indicates high resistance. As described above, the MTJ device MTJ included in each of the plurality of weight storage cells 110 indicates low resistance or high resistance depending on the magnetization direction, which may correspond to a logic value ('1' or '0'). Accordingly, each of the weight storage cells 110 stores a logic value depending on the MTJ device MTJ, and the magnitude of the first input signal is determined depending on the magnitude of resistance of the MTJ device MTJ. Likewise, the magnitude of the first input signal may correspond to a logical value, and thus may correspond to the above-described weight.

Each of the plurality of weight storage cells 110 includes the MTJ device MTJ connected to the first bit line BL_1 and a first transistor. The gate of the first transistor is connected to the first word line WL_1 to connect the MTJ device MTJ and the calculation line CL depending on the first word line WL_1. The first transistor is turned on in response to a signal applied to the first word line WL_1.

When the first input signal is applied through the first bit line BL_1, a row of at least one of the plurality of weight storage cells 110 in the weight storage array 100 is selected by the first word line WL_1. As the first transistor in the selected at least one row is turned on, the first input signal is applied to the product operation array 200 through the calculation line CL.

Figure 3:
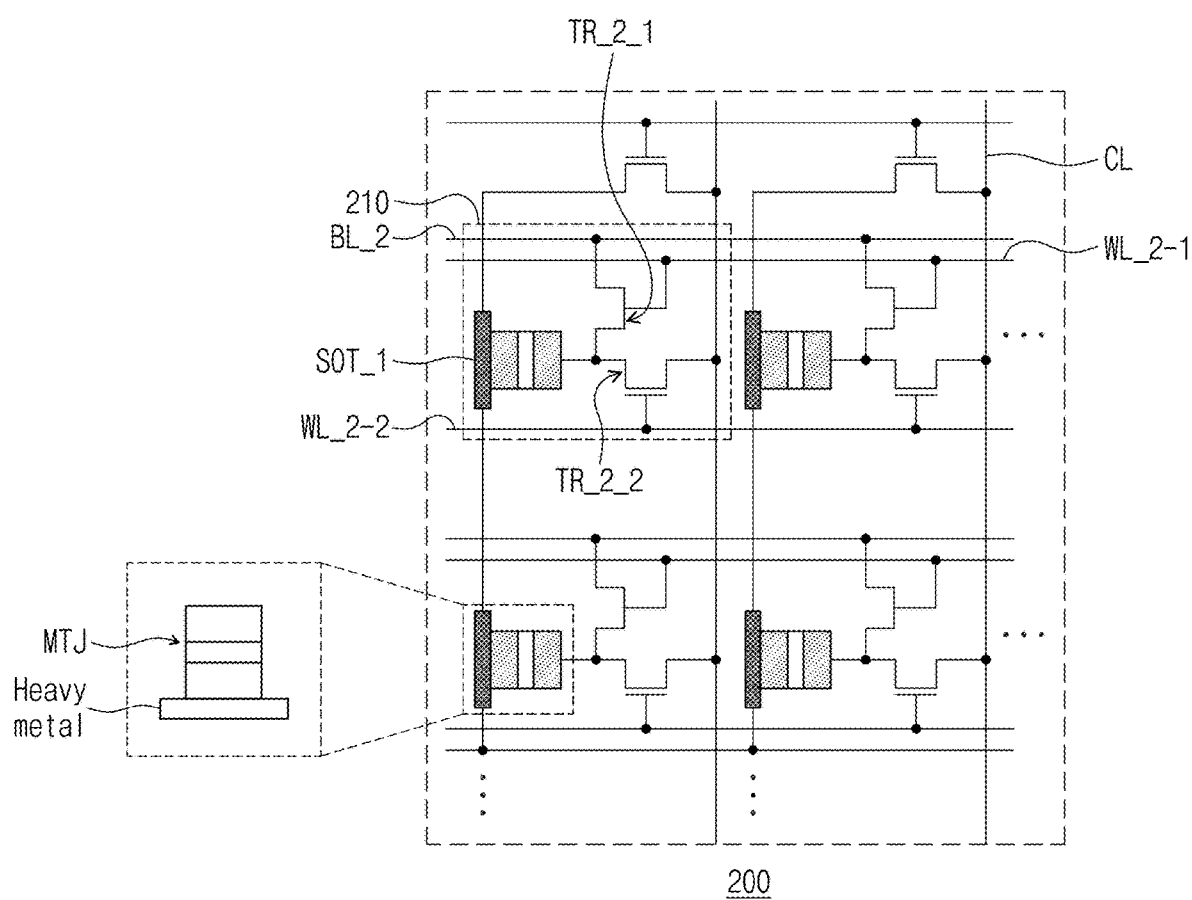
FIG. 3 illustrates a product operation array, according to an embodiment of the present disclosure.

FIG. 3 illustrates a product operation array, according to an embodiment of the present disclosure.

Referring to FIG. 3, the product operation array 200 includes the plurality of product operation cells 210. The plurality of product operation cells 210 are connected to the second bit line BL_2, the 2-1st word line WL_2-1, and the 2-2nd word line WL_2-2 in a row direction, and is connected to the calculation line CL in a column direction. Each of the plurality of product operation cells 210 includes a first spin orbit torque (SOT) device. Each of the plurality of product operation cells 210 reads a first input signal from at least one of the plurality of weight storage cells 110, and performs a product operation of the first input signal and a second input signal applied through the second bit line BL_2.

As illustrated in drawings, the SOT device has a structure in which a heavy metal is coupled to the MTJ device MTJ described above. A write current may flow to the heavy metal of the SOT device. When the write current has a magnitude exceeding a threshold value, the current direction may be switched. The threshold value for switching the current direction of the write current may be adjusted depending on the voltage $V_{MTJ}$ applied to the pinned layer of the SOT device. Furthermore, the magnitude (high resistance or low resistance) of the resistance of the MTJ device MTJ is determined depending on the current direction of the write current.

Each of the plurality of product operation cells 210 includes a first SOT device SOT_1, a 2-1st transistor TR_2-1, and a 2-2nd transistor TR_2-2.

The first SOT device SOT_1 receives the first input signal from the calculation line CL. For example, as shown in drawings, the heavy metal of the first SOT device SOT_1 is connected to the calculation line CL through a separate transistor to receive the first input signal.

A gate of the 2-1st transistor TR_2-1 is connected to the 2-1st word line WL_2-1, and the 2-1st transistor TR_2-1 connects the second bit line BL_2 and the first SOT device SOT_1 depending on the 2-1st word line WL_2-1. The 2-1st transistor TR_2-1 is turned on in response to a signal applied to the 2-1st word line WL_2-1. When the 2-1st transistor TR_2-1 is turned on, the second input signal is applied to the first SOT device SOT_1 through the second bit line BL_2.

Here, the second input signal may correspond to $V_{MTJ}$ and has a logic value depending on the level of $V_{MTJ}$.

A gate of the 2-2nd transistor TR_2-2 is connected to the 2-2nd word line WL_2-2, and the 2-2nd transistor TR_2-2 connects the first SOT device SOT_1 and the calculation line CL depending on the 2-2nd word line WL_2-2. The 2-2nd transistor TR_2-2 is turned on in response to a signal applied to the 2-2nd word line WL_2-2. When the 2-2nd transistor TR_2-2 is turned on, the current flowing through the first SOT device SOT_1 is delivered to the calculation line CL.

The product operation array 200 reads a first input signal from at least one of the plurality of weight storage cells 110 based on the weight storage cell 110 described above, and perform a product operation of the first input signal and a second input signal applied through the second bit line BL_2.

Figure 4:
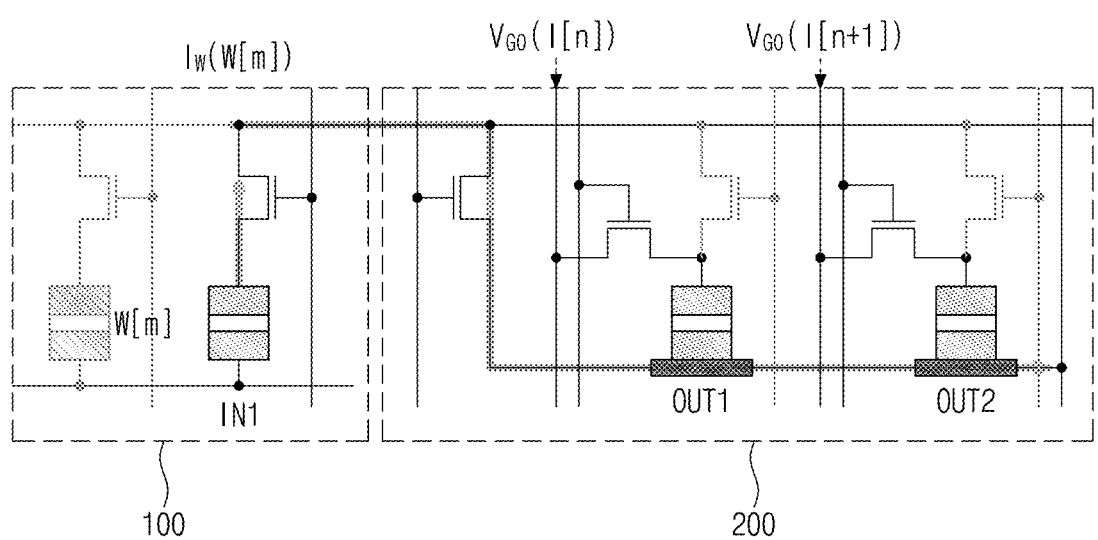
FIG. 4 is for describing a product operation.

FIG. 4 is for describing a product operation.

Referring to FIG. 4, the weight storage array 100 applies a first input signal to the product operation array 200. In the case, the first input signal has a magnitude according to the resistance that varies depending on the magnetization direction of the MTJ device MTJ. The first input signal may be simultaneously applied to a column of the product operation array 200 and may be shared. Each output of a SOT device included in a column is obtained by performing a product operation based on a NAND (or AND) operation on the first input signal and the second input signal as shown in Table 1 below.

TABLE 1

| First input signal (IN) | Second input signal ($V_{G0}$) | Result signal (OUT) of product operation |
|---|---|---|
| 0 (high resistance) | 0 (0[V]) | 1 (no switching) |
| 1 (low resistance) | 0 (0[V]) | 1 (no switching) |
| 0 (high resistance) | 1 (Vg) | 1 (no switching) |
| 1 (low resistance) | 1 (Vg) | 0 (switching) |

As shown in Table 1, only when both logic values of the first input signal and the second input signal are '1', the logic value of the result signal of the product operation is '0' (1 in case of NAND). In other cases, the logic value of the result signal of the product operation is output as '1'. Accordingly, the product operation may be performed. As described above, the NAND-based product operation may be performed in parallel because the first input signal is shared.

In a case of FIG. 4, assuming that the resistance of the MTJ device MTJ of the weight storage array 100 is a weight W[m] (here, 'm' is a weight index), the first input signal IN1 is applied in a form of $I_W(W[m])$ to the product operation array 200 through the MTJ device MTJ, and second input signals $V_{G0}(I[n])$ and $V_{G0}(I[n+1])$ are applied to each SOT device included in a column of the product operation array 200. When the magnitude of the first input signal is sufficient, and the direction of the signal (i.e., the result signal of the product operation) flowing through the heavy metal of the SOT device is switched because the threshold of the SOT device is lowered depending on the second input signal, the result signal of the product operation may have logic value '0'. When the direction of the signal is not switched, the result signal of the product operation may have logic value '1'.

As mentioned above, the product operation array 200 may perform a product operation based on an event that the direction of the first input signal flowing through the first SOT device SOT_1 is switched depending on the magnitude of the first input signal and the magnitude of the second input signal. The result signal of the product operation may have a logic value depending on whether the direction of the first input signal is switched.

Figure 5:
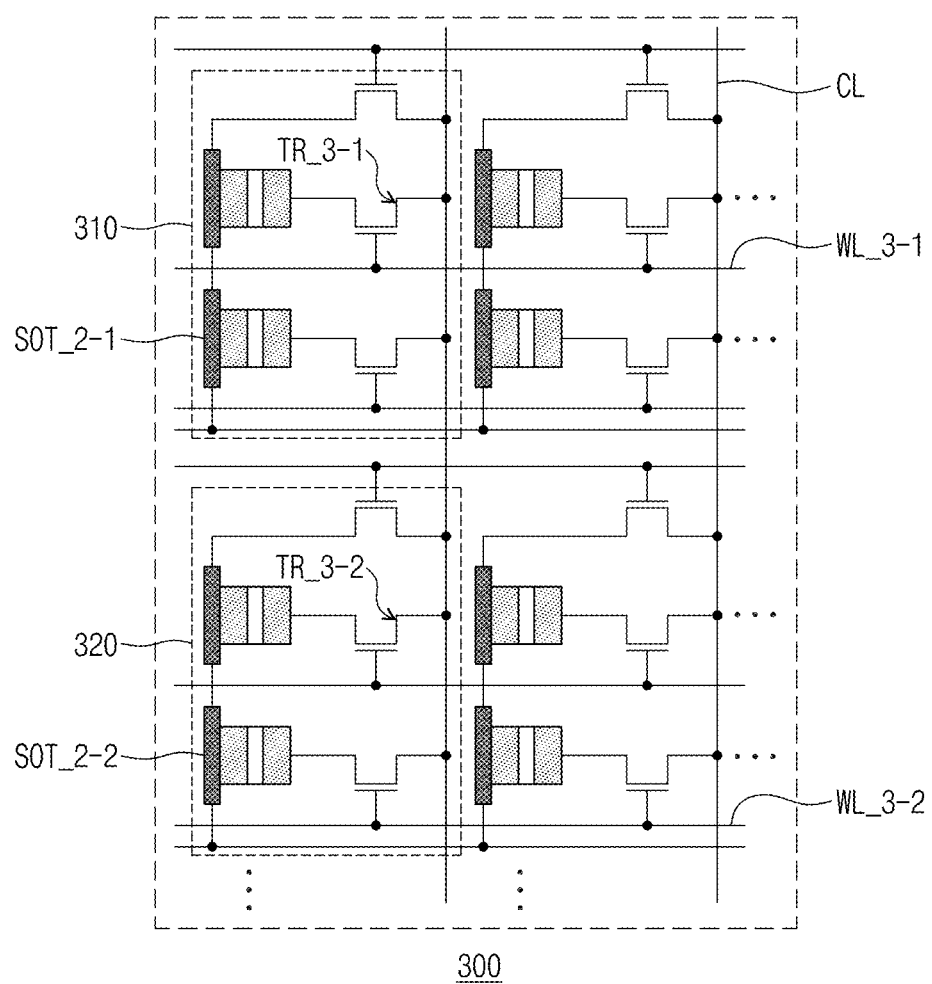
FIG. 5 illustrates a sum operation array, according to an embodiment of the present disclosure.

FIG. 5 illustrates a sum operation array, according to an embodiment of the present disclosure.

Referring to FIG. 5, the sum operation array 300 may include a plurality of carry cells 310 and a plurality of sum cells 320. The plurality of carry cells 310 is connected to the plurality of sum cells 320 through the calculation line CL.

When the 2-2nd transistor TR_2-2 is turned on, the plurality of carry cells 310 receives a result signal of a product operation from at least one of the plurality of product operation cells 210 through the calculation line CL, and stores a carry signal for a sum operation of the result signal of the product operation.

Each of the plurality of carry cells 310 includes at least one 2-1st SOT device SOT_2-1 and at least one 3-1st transistor. In the case of FIG. 5, it is shown that each of the at least one 2-1st SOT device SOT_2-1 and the at least one 3-1st transistor is two. However, it is obvious that the number varies depending on the design.

The at least one 2-1st device receives the result signal of the product operation from the calculation line CL. The heavy metals of the at least 2-1st devices are connected in series to each other, and thus the same current flows to the heavy metals.

The gate of at least one 3-1st transistor is connected to the at least one 3-1st word line WL_3-1, and at least one 3-1st transistor connects the at least one 2-1st SOT device SOT_2-1 to the calculation line CL depending on the at least one 3-1st word line WL_3-1. The at least one 3-1st transistor is turned on in response to the signal applied to the at least one 3-1st word line WL_3-1 to apply the carry signal to the calculation line CL.

Each of the plurality of sum cells 320 performs a sum operation on the result signal of the product operation and stores a sum signal for the sum operation.

Each of the plurality of sum cells 320 includes a 2-2nd SOT device SOT_2-2 and a 3-2nd transistor.

The 2-2nd SOT device SOT_2-2 receives the result signal and carry signal of the product operation through the calculation line CL.

The gate of the 3-2nd transistor is connected to the 3-2nd word line WL_3-2, and the 3-2nd transistor connects the 2-2nd SOT device SOT_2-2 to the calculation line CL depending on the 3-2nd word line WL_3-2. The 3-2nd transistor is turned on in response to the signal applied to the 3-2nd word line WL_3-2 and applies a sum signal to the calculation line CL.

Figure 6A:
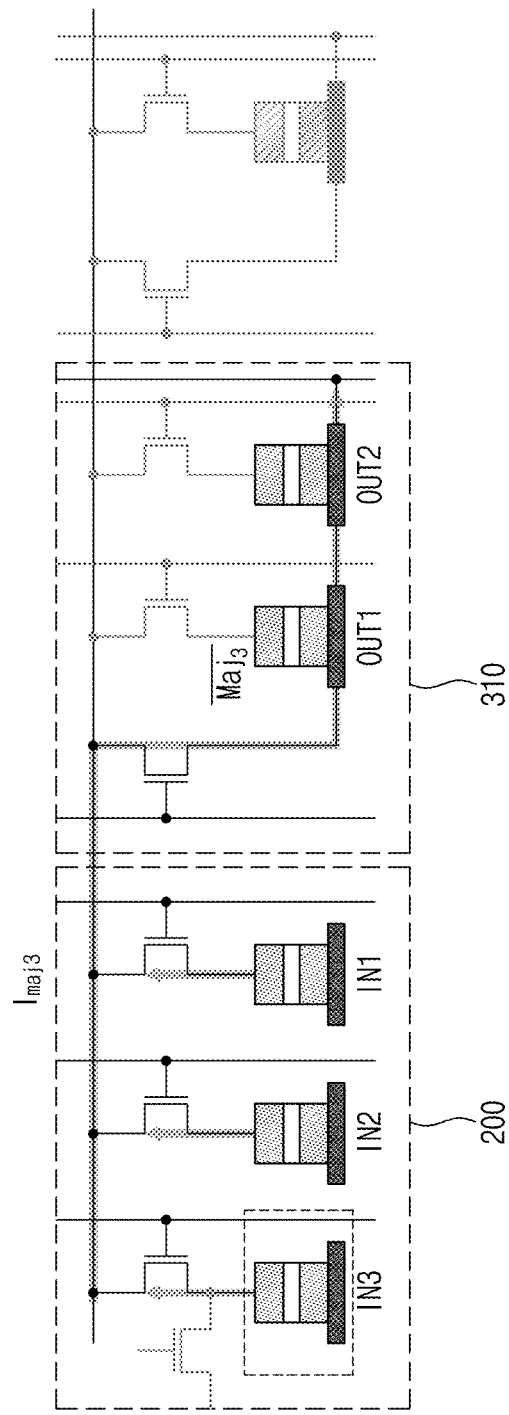
FIGS. 6A and 6B are for describing a sum operation.
Figure 6B:
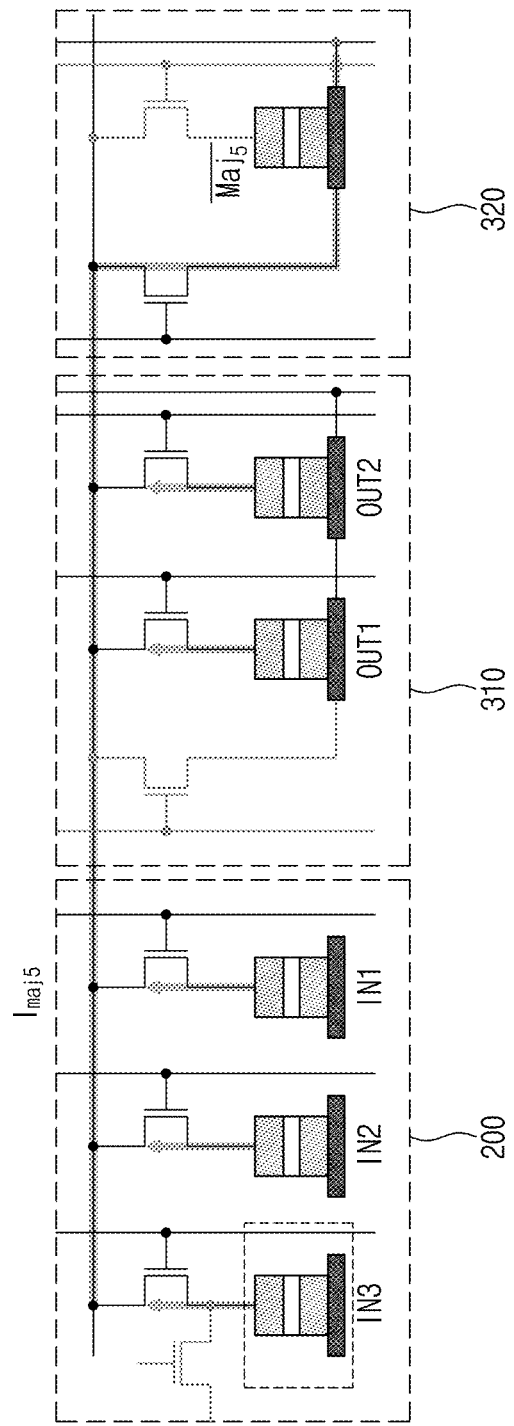

FIGS. 6A and 6B are for describing a sum operation.

Referring to FIG. 6A, first of all, each of the plurality of carry cells 310 receives a result signal IN of a product operation from the product operation array 200 through the calculation line CL. In this case, each of the plurality of carry cells 310 reads a result signal of a product operation from at least one of the plurality of product operation cells 210 through the calculation line CL. When the plurality of product operation cells 210 are present, each of the plurality of carry cells 310 reads an accumulated signal obtained by accumulating result signals of a plurality of product operation.

The result signals of the plurality of product operations flow through the at least one 2-1st SOT device SOT_2-1, (in detail, heavy metal). In the case, the magnetization direction of the at least one 2-1st SOT device SOT_2-1 may be switched depending on a magnitudes obtained by accumulating result signals of the plurality of product operations.

Accordingly, each of the plurality of carry cells 310 stores a carry signal OUT based on an event that the magnetization direction of the 2-1st SOT device SOT_2-1 is switched depending on the magnitude of the result signal of the product operation flowing through the at least one 2-1st SOT device SOT_2-1.

Referring to FIG. 6B, each of the plurality of sum cells 320 reads an accumulated signal $I_{maj5}$ s of a result signal and the carry signal of the product operation through the calculation line CL from the carry cell 310 and at least one of the plurality of product operation cells 210.

The accumulated signal flows through the 2-2nd SOT device SOT_2-2 (in detail, heavy metal). In the case, the magnetization direction of the 2-2nd SOT device SOT_2-2 may be switched depending on the magnitude of the accumulated signal. Accordingly, the plurality of sum cells 320 stores a sum signal based on an event that the magnetization direction of the 2-2nd SOT device SOT_2-2 is switched depending on the magnitude of the accumulated signal of the result signal and the carry signal of the operation flowing through the 2-2nd SOT device SOT_2-2.

As described above, the sum operation array 300 may perform a full adder logic gate-based sum operation on a result signal of a product operation through a carry signal and a sum signal. In particular, the sum operation array 300 has a structure in which a current is shared in a plurality of SOT devices when a carry signal is generated, only two steps are required for calculation.

Hereinafter, the overall operation of the processing-in-memory device based on the weight storage array 100, the product operation array 200, and the sum operation array 300 described above will be described.

Figure 7A:
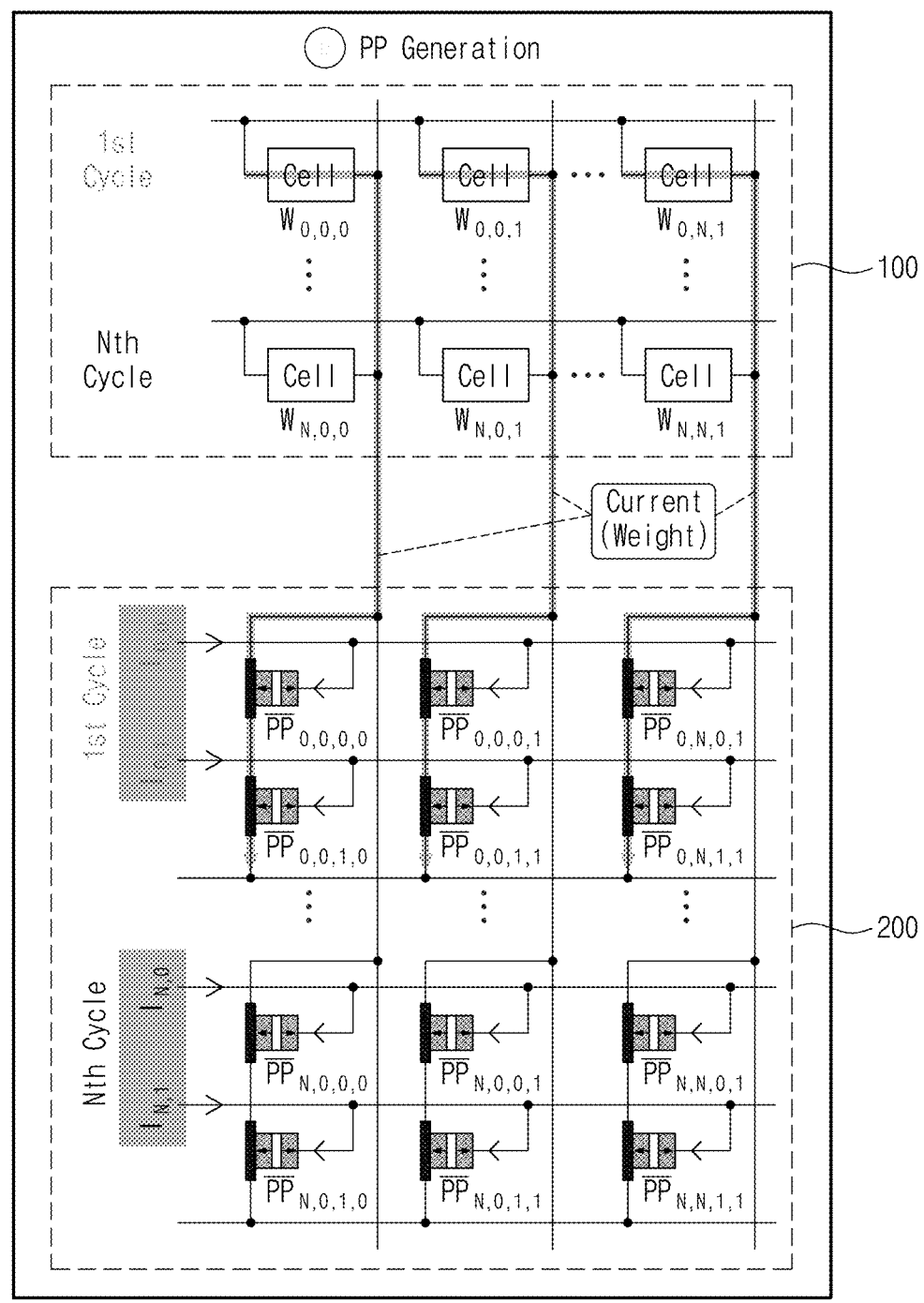
FIGS. 7A to 7C are for describing an operation of a processing-in-memory device, according to an embodiment of the present disclosure.
Figure 7B:
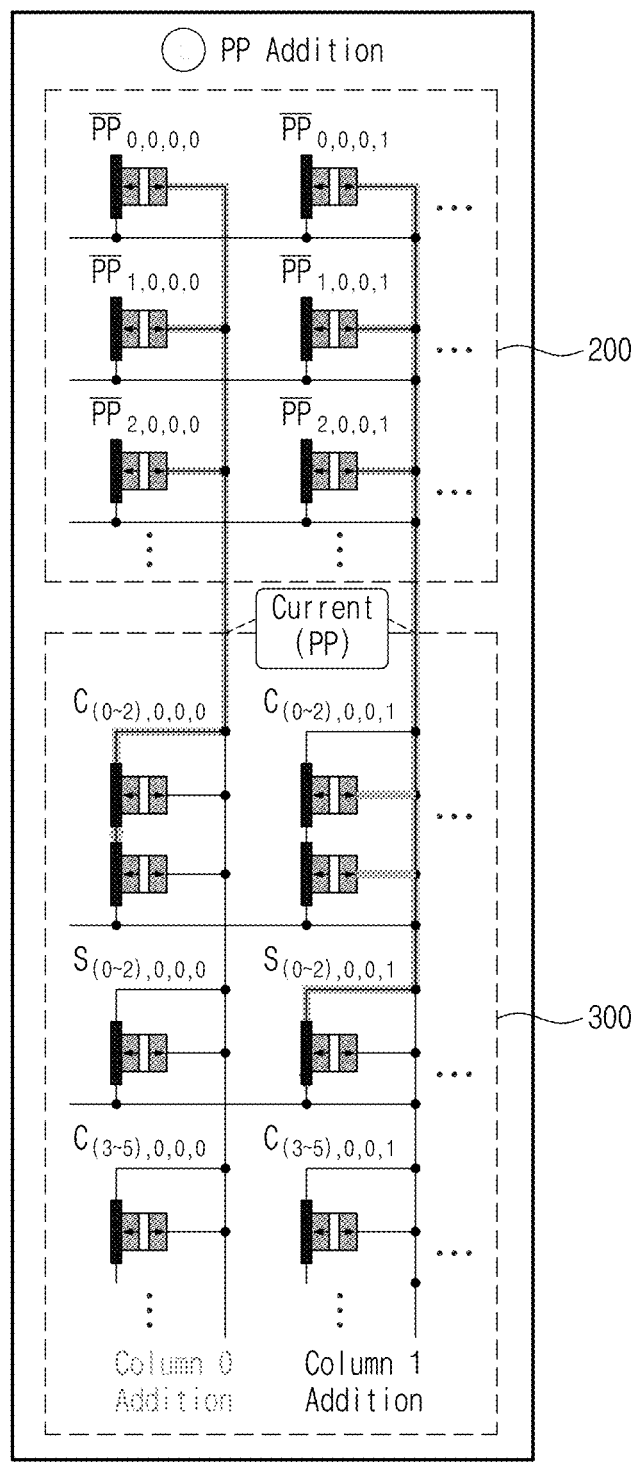
Figure 7C:
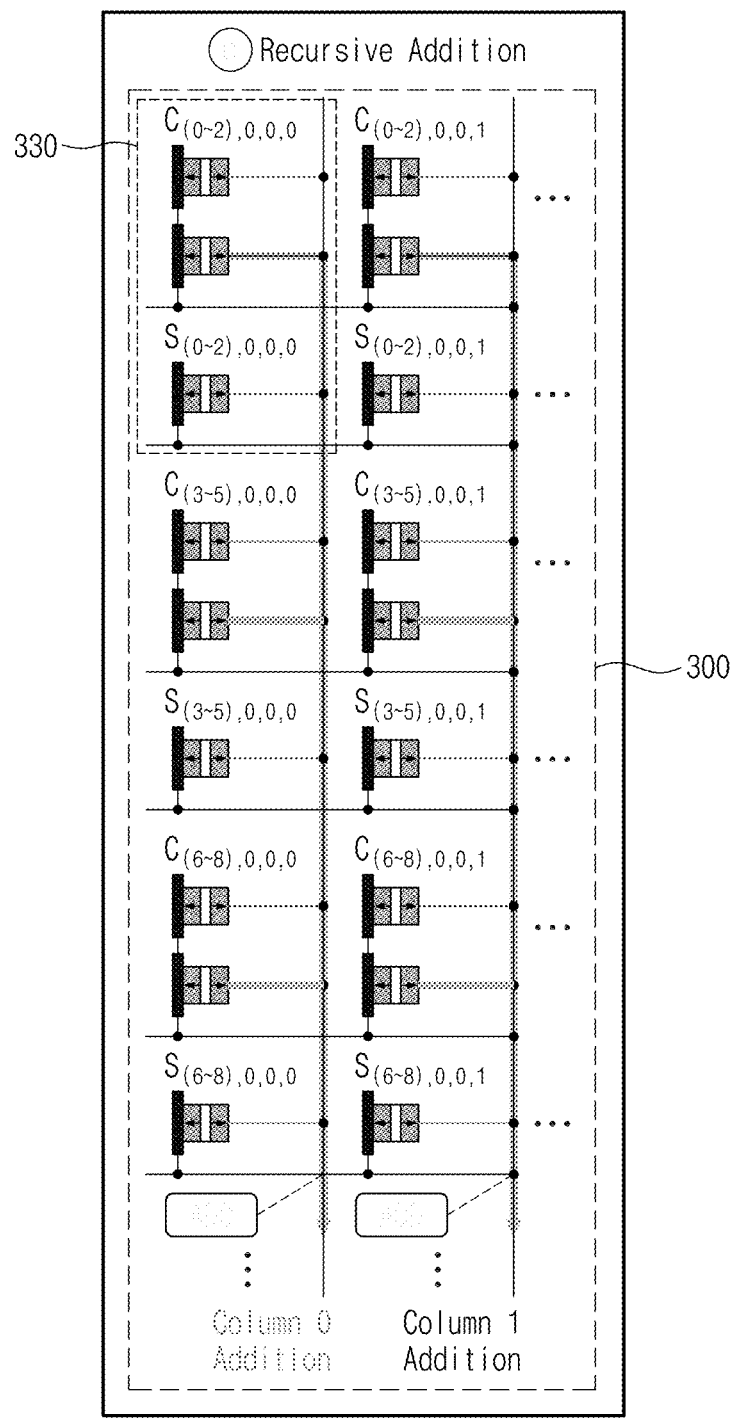

FIGS. 7A to 7C are for describing an operation of the processing-in-memory device 10, according to an embodiment of the present disclosure.

Referring to parameters shown in FIGS. 7A to 7C, $W_{(i\text{-}index),(o\text{-}index),(bit)}$ denotes a weight; $I_{(i\text{-}index),(bit)}$ denotes a second input signal; $PP_{(i\text{-}index),(o\text{-}index),(bit),(W\text{-}bit)}$ denotes a result signal of a product operation; $C_{(i\text{-}index),(o\text{-}index),(bit),(W\text{-}bit)}$ denotes a carry signal; $S_{(i\text{-}index),(o\text{-}index),(bit),(W\text{-}bit)}$ denotes a sum signal; each of i-index and o-index denote an index of input/output data of a MAC operation; a bit denotes a binary value; and, a W-bit denotes a binary value of the weight.

Referring to FIG. 7A, the generation of PP is performed from the $1^{st}$ cycle to the Nth cycle. Each period may correspond to each row of the weight storage array 100 and the product operation array 200.

A first input signal is applied to the product operation array 200 through the calculation line CL depending on the weight $W_{(i\text{-}index),(o\text{-}index),(bit)}$ stored in the weight storage array 100. The product operation array 200 reads the first input signal and the second input signal and performs a product operation.

Referring to FIG. 7B, after the product operation is performed, a sum operation is performed. The result signal of the product operation according to the product operation of the product operation array 200 is applied to the sum operation array 300 (in detail, the carry cell 310), and the carry cell 310 generates a carry signal.

Afterward, the result signal and the carry signal of the product operation are applied to the sum cell 320, and the sum cell 320 generates a sum signal. The sum operation may be commonly performed on a row of the sum operation array 300.

Referring to FIG. 7C, the sum operation may be repeatedly performed. According to an embodiment, the sum operation array 300 may have a structure in which the carry cell 310 and the sum cell 320 are alternately connected in a row direction. Assuming that a cell in which the carry cell 310 and the sum cell 320 are combined with each other is referred to as a "unit cell 330", the sum operation array 300 may have a structure in which the unit cells 330 are sequentially connected in a row. Each of the unit cells 330 may perform a sum operation on a result signal of a product operation for the input data of a specific unit (e.g., three in FIG. 7C).

As described above, the weight storage array 100, the product operation array 200, and the sum operation array 300 included in the processing-in-memory device 10 may be connected through the calculation line CL to perform a MAC calculation. In particular, the calculation line CL defines a column line of the weight storage array 100, the product operation array 200, and the sum operation array 300. The weight storage array 100, the product operation array 200, and the sum operation array 300 may simultaneously perform MAC operations on these column lines.

Figure 8:
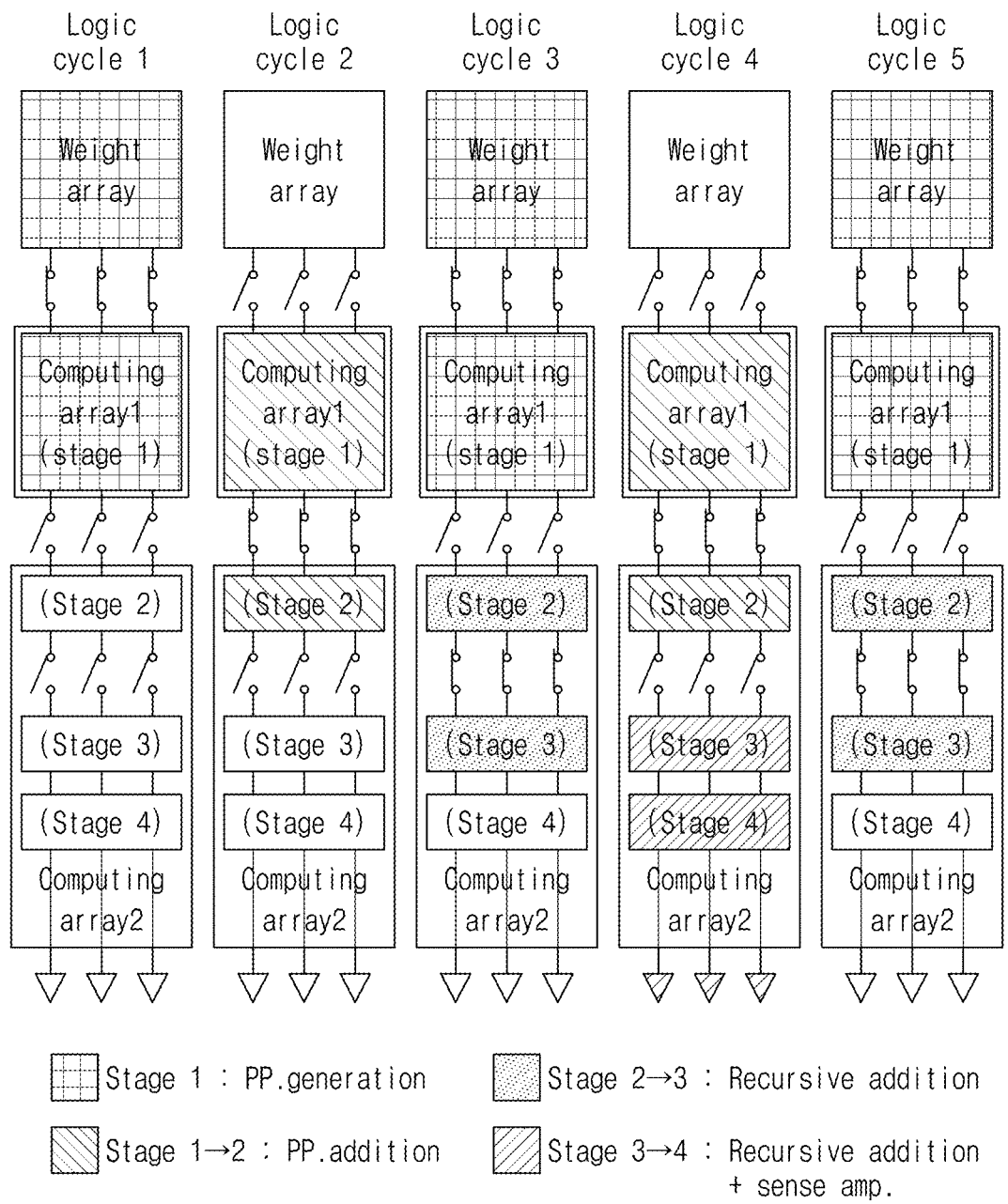
FIG. 8 illustrates an intra-memory array pipelining structure.

FIG. 8 illustrates an intra-memory array pipelining structure.

Referring to FIG. 8, an intra-memory array pipelining structure may be applied to the processing-in-memory device 10 described above, and thus, the memory device may perform more parallel operations.

FIG. 9 is a flowchart of a method of operating a processing-in-memory device, according to an embodiment of the present disclosure. Hereinafter, detailed descriptions of portions the same as the above-described portions are omitted to avoid redundancy.

Referring to FIG. 9, in S110, the processing-in-memory device 10 applies a first input signal to the product operation array 200 through the weight storage cell 110. In detail, when the first input signal is applied through the first bit line BL_1, a row of at least one of the plurality of weight storage cells 110 is selected by the first word line WL_1. As the first transistor in the selected at least one row is turned on, the first input signal is applied to the product operation array 200 through the calculation line CL.

In S120, the processing-in-memory device 10 performs a product operation of the first input signal and the second input signal. In detail, the product operation array 10 included in the processing-in-memory device 10 may perform a product operation based on an event that the direction of the first input signal flowing through the first SOT device SOT_1 is switched depending on the magnitude of the first input signal and the magnitude of the second input signal. The result signal of the product operation may have a logic value depending on whether the direction of the first input signal is switched.

In S130, the processing-in-memory device 10 performs a sum operation on the result signal of the product operation. In detail, the sum operation array 300 included in the processing-in-memory device 10 performs a full adder logic gate-based sum operation on the result signal of the product operation through a carry signal and a sum signal.

According to various embodiments of the present disclosure, a spin orbit torque device-based processing-in-memory device may include a digital logic gate using a current switching and voltage controlled magnetic anisotropy (VCMA) effect of a spin orbit torque device capable of being used as a memory element, and may increase the overall system energy efficiency by designing a memory capable of performing an MAC operation to reduce the number of data migration between a memory and an operator.

Moreover, issues on the area size and energy consumption of the existing ADC may be solved by removing an ADC through replacing an analog MAC operation method through current accumulation used in the conventional resistive element-based PIM with a digital MAC method of repeatedly performing a digital logic operation inside a memory. Besides, power efficiency versus computational load TOPS/W and area efficiency versus computational load TOPS/mm$^2$, which are increased by removing the ADC, are shown.

Examples of the proposed method in the above description may also be included as one of the implementation methods of the present disclosure, and thus it is obvious that they are regarded as a type of proposal methods. Moreover, the proposed methods described above may be implemented independently, but may be implemented in a combination (or merging) form of some proposed methods.

According to various embodiments of the present disclosure, the following effects are obtained.

According to various embodiments of the present disclosure, a spin orbit torque device-based processing-in-memory device may include a digital logic gate using a current switching and voltage controlled magnetic anisotropy (VCMA) effect of a spin orbit torque device capable of being used as a memory element, and may increase the overall system energy efficiency by designing a memory capable of performing an MAC operation to reduce the number of data migration between a memory and an operator.

Moreover, issues on the area size and energy consumption of the existing ADC may be solved by replacing an analog MAC operation method through current accumulation used in the conventional resistive element-based PIM with a digital MAC method of repeatedly performing a digital logic operation inside a memory.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A processing-in-memory device, comprising:
   a weight storage array including a plurality of weight storage cells, each of which includes a magnetic tunnel junction (MTJ) device having resistance determined depending on a magnetization direction and in each of which a first input signal having one of logic values depending on the resistance is applied through a bit line;
   a product operation array including a plurality of product operation cells, each of which reads out the first input signal from at least one weight storage cell among the plurality of weight storage cells and performs a product operation of the first input signal and a second input signal applied through a voltage application line; and
   a sum operation array including a plurality of sum operation cells, each of which reads out a result signal of a product operation from at least one product operation cell among the plurality of product operation cells and performs a sum operation on the result signal of the product operation, wherein the weight storage array, the product operation array, and the sum operation array are connected to each other through a calculation line to perform a multiply accumulation (MAC) operation.

2. The processing-in-memory device of claim 1, wherein each of the plurality of weight storage cells includes:
   the MTJ device connected to the bit line; and
   a first transistor including a gate connected to a first word line and configured to connect the MTJ device and the calculation line depending on the first word line.

3. The processing-in-memory device of claim 2, wherein, when a row of at least one of the plurality of weight storage cells is selected by the first word line, the weight storage array applies the first input signal to the product operation array through the calculation line in the at least one row.

4. The processing-in-memory device of claim 1, wherein each of the plurality of product operation cells includes:
   a first spin orbit torque (SOT) device configured to receive the first input signal from the calculation line;
   a 2-1st transistor including a gate connected to a 2-1st word line and configured to connect the voltage application line and the first SOT device depending on the 2-1st word line; and
   a 2-2nd transistor including a gate connected to a 2-2nd word line and configured to connect the first SOT device and the calculation line depending on the 2-2nd word line.

5. The processing-in-memory device of claim 4, wherein the product operation array performs a product operation based on an event that a direction of the first input signal flowing through the first SOT device is switched depending on a magnitude of the first input signal and a magnitude of the second input signal, and
   wherein the result signal of the product operation has a logic value depending on whether the direction of the first input signal is switched.

6. The processing-in-memory device of claim 4, wherein the sum operation array includes:
   a plurality of carry cells, each of which receives the result signal of the product operation from at least one product operation cell among the plurality of product operation cells through the calculation line depending on an event that the 2-2nd transistor is turned on, and stores a carry signal for a sum operation of the result signal of the product operation; and
   a plurality of sum cells, each of which stores a sum signal for the sum operation of the result signal of the product operation.

7. The processing-in-memory device of claim 6, wherein each of the plurality of carry cells includes:
   at least one 2-1st SOT device configured to receive the result signal of the product operation; and
   at least one 3-1st transistor including a gate connected to at least one 3-1st word line and configured to connect the at least one 2-1st SOT device and the calculation line depending on the at least one 3-1st word line.

8. The processing-in-memory device of claim 7, wherein each of the plurality of carry cells stores the carry signal based on an event that a direction of the result signal of the product operation is switched depending on a magnitude of the result signal of the product operation flowing through the at least one 2-1st SOT device.

9. The processing-in-memory device of claim 6, wherein each of the plurality of sum cells includes:
   a 2-2nd SOT device configured to receive the carry signal and the result signal and the product operation; and
   the 3-2nd transistor including a gate connected to a 3-2nd word line and configured to connect the 2-2nd SOT device and the calculation line depending on the 3-2nd word line.

10. The processing-in-memory device of claim 9, wherein each of the plurality of sum cells stores the sum signal based on-based on an event that a direction of an accumulated signal is switched depending on a magnitude of the accumulated signal of the carry signal and the result signal and the product operation flowing through the 2-2nd SOT device.

11. A processing-in-memory device comprising:

a weight storage array including a plurality of weight storage cells, each of which includes an MTJ device having resistance determined depending on a magnetization direction and in each of which a first input signal having one of logic values depending on the resistance is applied through a bit line;

a product operation array including a plurality of product operation cells, each of which reads out the first input signal from at least one weight storage cell among the plurality of weight storage cells and performs a product operation of the first input signal and a second input signal applied through a voltage application line;

a sum operation array including a plurality of sum operation cells, each of which reads out a result signal of a product operation from at least one product operation cell among the plurality of product operation cells and performs a sum operation on the result signal of the product operation; and a calculation line configured to connect the weight storage array, the product operation array, and the sum operation array, wherein the calculation line defines a column line of the weight storage array, the product operation array, and the sum operation array, and wherein the weight storage array, the product operation array, and the sum operation array simultaneously perform a multiply accumulation (MAC) operation on the column line.

\* \* \* \* \*